(12) United States Patent
Wong et al.

(10) Patent No.: US 7,147,834 B2
(45) Date of Patent: Dec. 12, 2006

(54) HYDROTHERMAL SYNTHESIS OF PEROVSKITE NANOTUBES

(75) Inventors: Stanislaus Wong, Middle Island, NY (US); Yuanbing Mao, Stony Brook, NY (US)

(73) Assignee: The Research Foundation of State University of New York, Albany, NY (US)

( * ) Notice: Subject to any disclaimer, the term of this patent is extended or adjusted under 35 U.S.C. 154(b) by 185 days.

(21) Appl. No.: 10/916,048

(22) Filed: Aug. 11, 2004

(65) Prior Publication Data

US 2005/0036939 A1 Feb. 17, 2005

Related U.S. Application Data

(60) Provisional application No. 60/494,474, filed on Aug. 11, 2003.

(51) Int. Cl.
*C01D 1/02* (2006.01)
*C01F 11/02* (2006.01)
*C01F 17/00* (2006.01)
*C01G 1/00* (2006.01)
*C01G 23/00* (2006.01)

(52) U.S. Cl. ............ 423/593.1; 423/598; 423/594.12; 423/594.8; 423/595; 423/599; 423/594.1; 423/594.3; 423/594.5; 423/594.14; 423/594.15; 423/596; 423/594.2; 423/594.4; 423/596.6; 423/594.16; 423/263; 423/594.9; 977/812; 977/963; 204/157.42

(58) Field of Classification Search ............. 423/593.1, 423/598, 594.12, 594.8, 595, 599, 594.1, 423/594.3, 594.5, 594.14, 594.15, 596, 594.2, 423/594.4, 594.6, 594.16, 263, 594.9; 977/812, 977/963; 204/157.42
See application file for complete search history.

(56) References Cited

U.S. PATENT DOCUMENTS

| | | | |
|---|---|---|---|
| 2003/0026985 A1* | 2/2003 | Greiner et al. | 428/373 |
| 2005/0064731 A1* | 3/2005 | Park et al. | 438/800 |
| 2006/0008696 A1* | 1/2006 | Cha et al. | 429/38 |

* cited by examiner

*Primary Examiner*—Timothy C. Vanoy
(74) *Attorney, Agent, or Firm*—Scully, Scott, Murphy & Presser, P.C.

(57) ABSTRACT

A low-temperature hydrothermal reaction is provided to generate crystalline perovskite nanotubes such as barium titanate ($BaTiO_3$) and strontium titanate ($SrTiO_3$) that have an outer diameter from about 1 nm to about 500 nm and a length from about 10 nm to about 10 micron. The low-temperature hydrothermal reaction includes the use of a metal oxide nanotube structural template, i.e., precursor. These titanate nanotubes have been characterized by means of X-ray diffraction and transmission electron microscopy, coupled with energy dispersive X-ray analysis and selected area electron diffraction (SAED).

19 Claims, 3 Drawing Sheets

HYDROTHERMAL SYNTHESIS OF PEROVSKITE NANOTUBES

RELATED APPLICATIONS

This application claims benefit of U.S. Provisional Application Ser. No. 60/494,474, filed Aug. 11, 2003, entitled "HYDROTHERMAL SYNTHESIS OF PEROVSKITE NANOTUBES", the entire content of which is incorporated herein by reference.

FIELD OF THE INVENTION

The present invention relates to nanoscale ferroelectric materials, and more particularly to perovskite nanotubes as well as a method of synthesizing the same.

BACKGROUND OF THE INVENTION

Understanding the behavior of ferroelectric materials at the nanoscale dimension is of importance to the development of molecular electronics, in particular for random access memory (RAM) and logic circuitry. Indeed, transition metal oxides with a perovskite structure are noteworthy for their advantageous dielectric, piezoelectric, electrostrictive, pyroelectric and electro-optic properties with the corresponding applications in the electronics industry for pyroelectronic detectors, imaging devices, optical memories, modulators, deflectors, transducers, actuators, and high-k dielectric constant materials. Such properties and applications for perovskite oxides are described, for example, in N. A. Hill, *J. Phys. Chem. B*, 2000, 104, 6694, J. F. Scott, *Ferroelectr. Rev.*, 1998, 1, 1, and A. J. Millis, *Nature*, 1998, 392, 147.

As reported by T. K. Song, et al., *Solid State Commun.*, 1996, 97, 143, the perovskite oxides including, for example, $BaTiO_3$ and $SrTiO_3$, typically exhibit nonlinear optical coefficients and large dielectric constants. Because these effects are dependent on the metallic elemental ratios, impurities, microstructure and finite size, considerable effort has been expended in the controllable synthesis of crystalline materials and thin films of these ferroelectric oxides. See, in this regard, L. A. Willis, et al., *AppL. Phys. Lett.*, 1992, 60, 41, J. Zhang, et al., *AppL. Phys. Lett.*, 1994, 64, 2410, J. Zhao, et al., *J. Mater. Chem.*, 1997, 7, 933, and X. W. Wang, et al., *Mater. Sci. Eng. B*, 2001, 86, 29.

One-dimensional nanotube/nanowire systems offer fundamental scientific opportunities for investigating the influence of size and dimensionality of materials with respect to their collective optical, magnetic and electrochemical properties. S. O'Brien, et al., *J. Am. Chem. Soc.*, 2001, 123, 12085 have reported the fabrication of monodispersed nanoparticles of barium titanate with diameters ranging from 6 to 12 nm. The syntheses of barium titanate nanoparticles have also been described, for example, in Niederberger et al., Angew. Chem. Intl. Ed., v. 43, 2270 (2004).

Additionally, $BaTiO_3$ and $SrTiO_3$ nanorods, which are not hollow, have been fabricated by solution-phase decomposition of bimetallic alkoxide precursors in the presence of coordinating ligands, yielding well-isolated nanorods with diameters ranging from 5 to 60 nm and lengths up to >10 microns. The fabrication of nanorods using the solution-phase decomposition method has been described, for example, in J. J. Urban, et al., *J. Am. Chem. Soc.*, 2002, 124, 1186 and W. S. Yun, et al., *Nano Lett.*, 2002, 2, 447. It is evident, from these studies, that the structures of the barium, strontium, and titanium precursors used play an important role in determining the composition, particle size and monodispersity, morphology, and properties of the final product.

In addition to fabricating nanorods, the prior art also includes various methods of fabricating nanotubes. Nanotubes differ from nanorods because nanotubes typically have a hollow cavity, whereas nanorods are completely filled nanomaterials. $BaTiO_3$ and $PbTiO_3$ nanotubes have been developed using a sol-gel template synthesis process. Such a process is described, for example, by B. A. Hernandez, et al., *Chem. Mater.*, 2002, 14, 480, and B. A. Hernandez, et al., *J Korean Chem. Soc.*, 2002, 46, No. 3, 242. A sol-gel electrophoresis synthesis method for fabricating barium titanate nanorods is described, for example, in *Adv. Funct. Mater.*, v. 12(1), 59. The prior art sol-gel template process produces hollow nanotube bundles that have an outer diameter of 200 nm and a length of about 50 μm. The nanotube bundles produced using the sol-gel template process disclosed by B. A. Hernandez, et al. are neither isolated nanotubes nor ordered arrays, but instead are 'spaghetti-like' tangles that cannot be used for molecular electronic applications.

Other techniques besides the sol-gel template synthesis process disclosed in the Hernandez, et al. references have also been employed in fabricating ferroelectric nanotubes. F. D. Morrison, et al., *Los Alamos National Laboratory, Preprint Archive, Condensed Matter* (2003), pp. 1–19 describe the fabrication of ferroelectric nanotubes using misted chemical solution deposition (mCVD) and pore wetting.

U.S. Patent Publication 2003/0026985 A1 to Griener, et al. describes the formation of hollow fiber nanotubes having an internal diameter from 1 nm to 100 nm. The hollow nanotubes of this reference are produced by coating a degradable material with a non-degradable material and then degrading the degrading material. The prior art nanotubes disclosed in the Griener, et al. publication are biphasic and have significant amounts of amorphous impurities due to the nature in which the nanotubes are produced. By "biphasic", it is meant that the prior art nanotubes contain two very different materials with distinctive properties having a defined interface separating the two distinctive substances.

In many of the prior art methods described above, organometallic precursors, which are extremely toxic, expensive, unstable, explosive and/or pyrophoric, are employed. In addition, many of the prior art methods require that a high-temperature annealing process be used. As such, the prior art methods of fabricating perovskite nanotubes include harsh reaction conditions that may have an adverse effect on the resultant nanotubes.

In view of the drawbacks mentioned with the prior art methods of fabricating perovskite nanotubes, there is a continued need for providing a relatively simple and cost effective means for fabricating monophasic perovskite nanotubes that include mild, low-temperature solution conditions.

SUMMARY OF THE INVENTION

The present invention relates to monophasic perovskite nanotubes as well as a method of synthesizing the same. The term "monophasic" is used in the present invention to denote a perovskite nanotube that has a single phase, e.g., a cubic crystalline structure, in which the perovskite is homogeneously present throughout the nanotube structure. In addition to a cubic crystalline structure, the inventive nanotubes can have a rhombohedral, orthorhombic, or tetragonal crystalline structure. Hence, the inventive nanotube structure is comprised of a single component, i.e., perovskite; therefore no defined interface is present in the inventive nanotube.

The monophasic perovskite nanotubes of the present invention are characterized as having an outer diameter from about 1 nm to about 500 nm, preferably about 8 nm to about 100 nm, and a length from about 10 nm to about 10 μm, preferably 50 nm to about 1 μm. More preferably, the perovskite nanotubes of the present invention have an outer diameter from about 8 nm to about 15 nm and a length from about 50 nm to about 500 nm. In addition to having an outer diameter, the inventive perovskite nanotubes have an inner diameter from about 0.5 nm to about 500 nm, preferably about 4 nm to about 12 nm, with an inner diameter from about 4 nm to about 7 nm being more highly preferred.

The monophasic nanotubes of the present invention are further characterized as having a high aspect ratio on the order of about 2 or greater, preferably about 5 or greater, with an aspect ratio of about 10 to about 60 being more highly preferred. Moreover, the inventive monophasic perovskite nanotubes have a crystalline structure that has substantially no amorphous impurities therein. The crystalline structure can be cubic, rhombodedral, orthorhombic or tetragonal, with cubic being highly preferred. The term "substantially no amorphous impurities" is used in the present invention to describe nanotubes wherein the amorphous impurities are less than 1%. The term "amorphous" is used in the present invention to denote nanomaterials that lack a definite crystal structure. The monophasic perovskite nanotubes of the present invention are one-dimensional (i.e., an atomic linear chain) structures that are hollow. One-dimensional nanostructures are structures with nanometer-sized diameters and much, much longer lengths. In other words, the structures have a high aspect ratio and quantum effects become important for these systems.

Another aspect of the present invention relates to a method of synthesizing the above mentioned monophasic perovskite nanotubes. The method of the present invention comprises a wet-chemical, hydrothermal synthesis using an aqueous medium under alkaline conditions. The synthesis is performed at a low-temperature (on the order of about 150° C. or less) and under environmentally benign, user-friendly, mild synthetic conditions. Relatively inexpensive precursors and simple instrumentation are also employed in the method of the present invention.

In particular, the method of the present invention synthesizes monophasic perovskite nanotubes such as $BaTiO_3$, $SrTiO_3$, $Ba_{1-x}Sr_xTiO_3$ or $Ba(SrTiO_3)$ by first providing a metal oxide nanotube structural template, i.e., nanotube precursor, comprising a metal selected from Group IVB, VB, VIB, VIIB, VIIIB, IB or IIB of the Periodic Table of Elements. An illustrative example of a highly preferred metal oxide nanotube structural template employed in the present invention is a $TiO_2$ nanotube.

The nanotube structural template is a bona fide precursor material that is used in the present invention for generating the corresponding perovskite nanotubes in a controlled and rational manner. As such, the properties of the nanotube structural template are incorporated into the final perovskite nanotubes generated by the inventive process. That is, the tubular, hollow cylindrical formulation of the $TiO_2$ nanotube template is the structural basis for the subsequent chemical generation of the perovskite framework.

Under Schlenk conditions, i.e., in the absence of air, and $CO_2$, at least one precursor compound including a cation having a positive formula charge of from 1 to 3 such as $Ba(OH)_2$ and/or $SrCl_2$ is added to the nanotube structural template to provide a reaction mixture. The resultant reaction mixture is then refluxed in an inert atmosphere at a temperature of about 150° C. or less to provide a suspension of perovskite nanotubes. The perovskite nanotubes are recovered from the suspension using methods well known to those skilled in the art.

During reflux, the pH of the suspension is monitored and maintained within a pH range from about 10 to about 12 by adding a base and/or acid to the refluxed mixture. The maintenance of the pH within the aforementioned range lowers the amount of impurities present in the resultant monophasic perovskite nanotubes.

The present invention also provides a structure that includes an array of monophasic perovskite nanotubes, each nanotube having an outer diameter from about 1 nm to about 500 nm and a length from about 10 nm to about 10 μm. The array consists of perovskite nanotubes organized into an ordered assembly, whether by lithographic or chemical means. Self-assembly of nanotubes refers to a process of organization on a local scale driven by the presence of dominating forces, be they electrostatic or van der Waals, that result in the generation of larger more complex, structures in defines spatial arrangements. Studies of self-assembly of nanotubes permit a means of controlling intermolecular noncovalent interactions and for the rational design and synthesis of nanostructures.

DETAILED DESCRIPTION OF THE INVENTION

As stated above, the present invention provides perovskite nanotubes that are monophasic and have an outer diameter from about 1 nm to about 500 nm and a length from about 10 nm to about 10 micron. The perovskite nanotubes of the present invention have a structural formula $ABO_3$ wherein B is at least one metal selected from Group IVB, VB, VIB, VIIB, VIIIB, IB or IIB of the Periodic Table of Elements (CAS version), and A is at least one additional cation having a positive formula charge of from 1 to 3.

In the above formula, component A of the perovskite nanotube comprises a cation selected from the group consisting of K, Na, Rb, Cs, Li, Ba, Sr, La, Pb, Mg, Zn, Ca, Sc, Y, and mixtures thereof. In the present invention, it is highly preferred that component A of the perovskite nanotube is a cation of Ba and/or Sr.

Insofar as component B of the perovskite nanotube is concerned, B may include any metal within the group of metals listed above. Thus, for example, the B component of the perovskite nanotube may include a metal such as, for example, Ti, Zr, Hf, V, Nb, Ni, Fe, Co, Ta, Cr, Mo, W, Mn, Tc, Re, Ge, Sn, Ru, Os, Cd, Hg, Rh, Ir, Pd, Pt, Cu, Ag, Au, and/or Pb. Of these metals, it is highly preferred that Ti be used as the B component of the perovskite nanotubes of the present invention.

When Ti is employed as the B component in the above formula, titanate-based perovskite having the formula $ATiO_3$ are synthesized. Examples of such types of titanate-based nanomaterials that may be formed in the present invention include, but are not limited to: barium strontium titanate ($Ba(SrTiO_3)$; BSTO), barium titanate ($BaTiO_3$; BTO), strontium titanate ($SrTiO_3$; STO), lead zirconium titanate ($Pb(ZrTiO_3)$; PZTO), barium zirconium titanate ($Ba(ZrTiO_3)$; BZTO), and lead lanthanum titanate ($Pb(LaTiO_3)$; PLTO). Of the foregoing mentioned titanate-based nanomaterials, it is highly preferred in the present invention that the perovskite nanotube formed is barium titanate, $BaTiO_3$ or strontium titanate, $SrTiO_3$.

Figure 1A:
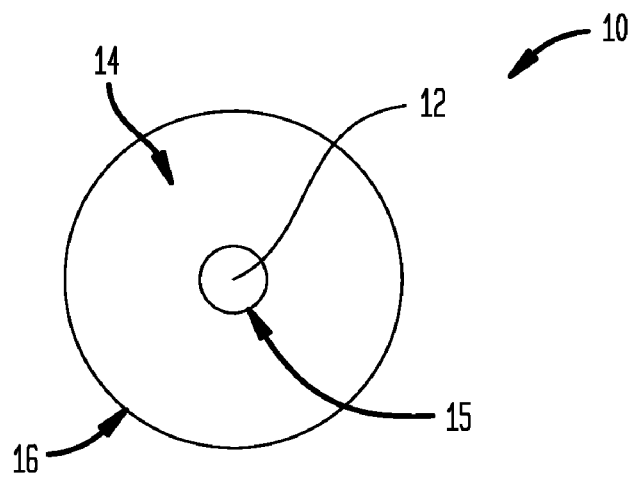
FIGS. 1A–1B are pictorial representations of the inventive perovskite nanotube that is formed using the wet chemical, hydrothermal synthesis process of the present invention.
Figure 1B:
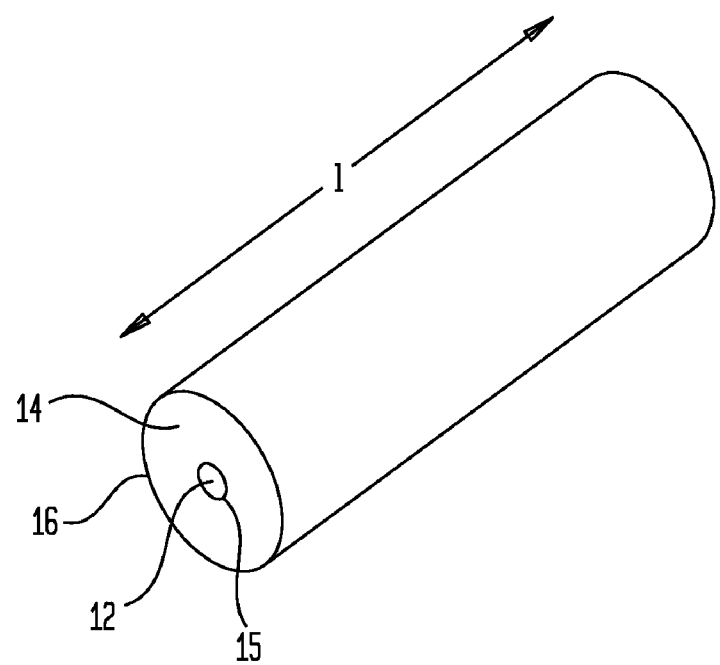

The perovskite nanotubes of the present invention are one-dimensional structures that have a hollow core; the nanotubes are thus unfilled in the center, which distinguishes them from nanorods. FIG. 1A shows a simple pictorial representation (through a cross sectional view) of the inventive monophasic perovskite nanotube, while FIG. 1B shows a simple pictorial representation of the inventive perovskite nanotube showing one end thereof. As shown, the perovskite nanotube 10 has a hollow core 12, surrounded by a wall 14 that has an inner diameter 15 and an outer diameter 16. In FIG. 1B, the letter 'l' denotes the length of the nanotube. Although a single walled nanotube is depicted, the present invention is not limited to the same. Thus, multi-walled, multi-shelled nanotubes are also contemplated herein.

The perovskite nanotubes of the present invention are characterized as having an outer diameter 16 from about 1 nm to about 500 nm and a length, l, from about 10 nm to about 10 μm. More preferably, the inventive perovskite nanotubes have an outer diameter 16 from about 8 nm to about 100 nm and a length, l, from about 50 nm to about 1 μm. Even more preferably, the perovskite nanotubes of the present invention have an outer diameter 16 from about 8 nm to about 15 nm and a length, l, from about 50 nm to about 500 nm. The inner diameter 15 of the inventive perovskite nanotube is from about 0.5 nm to about 500 nm, preferably from about 4 nm to about 12 nm, and even more preferably from about 4 nm to about 7 nm being more highly preferred.

The perovskite nanotubes of the present invention are further characterized as having a high aspect ratio on the order of about 2 or greater, preferably 5 or greater, with an aspect ratio of about 10 to about 60 being more highly preferred. The aspect ratio is based on the outer diameter dimension divided by the length. The inventive monophasic perovskite nanotubes also are characterized as having a crystalline structure, e.g., cubic, rhombohedral, orthorhombic or tetragonal, that has substantially no amorphous impurities therein. In accordance with the present invention, the nanotubes synthesized by the present invention having an amorphous impurity content of less than 1%.

The perovskite nanotubes of the present invention are formed utilizing a mild, low-temperature, hydrothermal synthesis method in which the nanotubes are generated using a metal oxide nanotube structural template as one precursor compound. The hydrothermal synthesis method of the present invention is performed in an aqueous medium and under alkaline base conditions.

Specifically, the hydrothermal synthesis method of the present invention begins with first providing a metal oxide nanotube structural template comprising a metal selected from Group IVB, VB, VIB, VIIB, VIIIB, IB or IIB of the Periodic Table of Elements. Of the various metals that may be employed in the present invention, it is highly preferred that the metal oxide nanotube structural template is $TiO_2$.

The metal oxide nanotube structural template is formed using procedures that are well known to those skilled in the art. For example, the procedures disclosed in T. Kasuga, et al., *Langmuir*, 1998, 14, 3160 and T. Kasuga, et al., *Adv. Mater.*, 1999, 11, 3160, the entire content of each reference is incorporated herein in its entirety by reference, may be employed in forming the metal oxide nanotube structural template.

Specifically, the nanotube structural template employed in the present invention is prepared by dissolving a metal oxide powder such as the anastase form of $TiO_2$ in an aqueous solution that contains a base such as NaOH, KOH, and LiOH. The resultant mixture is then refluxed under conditions such that a reaction takes place in which metal oxide nanotubes are formed. In particular, the refluxing is performed by heating a Nalgene bottle containing the dissolved metal oxide powder in an oil bath to a temperature from about 100° C. to about 120° C. for a time period from about 15 to about 30 hours. The reflux is conducted with continuous stirring of the dissolved metal oxide powder.

The amount of base added to the metal oxide powder may vary depending on the desired properties of the resultant nanotubes as appreciated by the skilled artisan. Typically, from about 50 to about 120 ml of 10 M base is added to about 10 grams of metal oxide powder.

After the reflux period has elapsed, the reflux mixture is treated with distilled water and an acid, such as, for example, HCl, and then the acid treated admixture is sonicated. The amount of acid added to the refluxed mixture may vary, but typically, from about 25 to about 32 ml of acid is added to about 10 ml of refluxed solution. The amount of distilled water used at this point of the present invention is typically from about 240 to about 350 ml per 30 ml of acid treated refluxed solution. The treated powders are then separated from the solution by centrifugation or filtration. The washing steps, i.e., acid treatment and distilled water addition, may be repeated any number of times until the resultant supernatant has a pH that is less than 6.

The metal oxide nanotube structural template produced using the above-described procedure, which includes the B component of the inventive perovskite nanotubes, is characterized as having needle-shaped structures with an inner diameter of about 4 nm and an outer diameter of about 8 nm, and a length of about several hundred nm.

Because the metal oxide nanotube structural template provides the B component of the inventive perovskite nanotubes, the inventive perovskite nanotubes have many of the physical properties of the metal oxide nanotube structural template. Hence, the length and diameter of the inventive perovskite nanotube is derived from the length and diameter of the nanotube precursor. As such, the nanotube structural template is employed as a precursor material itself in order to generate the corresponding perovskite nanotubes in a controlled and rational manner.

After providing the metal oxide nanotube structural template and transferring the same to a reaction vessel, at least one precursor compound comprising a cation having a positive formula charge of from 1 to 3 is added to a reaction vessel containing the nanotube structural template in the absence of air, and $CO_2$, i.e., under Schlenk conditions. In accordance with the present invention, the molar ratio of metal oxide to the precursor compound used in forming the perovskite nanotubes is from about 0.9:1 to about 1:0.9, with a molar ratio from about 1:1, based on nanotube structural template to precursor compound, being more highly preferred.

The reaction vessel employed in this step of the present invention is a Schlenk flask or any other reaction vessel that is capable of removing air, and $CO_2$ such that the metal oxide nanotube structural template and the precursor compound can interact in a controlled environment. In order to minimize contamination of products from atmospheric $CO_2$, which could lead to the generation of carbonate impurities in the resulting perovskite nanotubes, the reaction vessel is typically degassed.

The reaction mixture containing metal oxide nanotube structural template and precursor compound is then refluxed in an inert atmosphere at a temperature of about 150° C. or less to provide a suspension of perovskite nanotubes. More specifically, the temperature of reflux is from about 90 to about 140° C. The refluxing step occurs over an oil bath or any other temperature controlled device such as a hot plate with continuous stirring. The term "inert gas" denotes a gas that does not participate in the interaction between the metal oxide nanotube structural template and precursor compound. Illustrative examples of inert gases that can be employed during the refluxing step of the present invention include He, Ar, Kr, Ne, Xe, $N_2$ or mixtures thereof, such as He-Ar. Preferred inert gases employed in the present invention are Ar or $N_2$.

The refluxing step is performed for a time period that is sufficient to form a suspension of perovskite nanotubes in the reaction vessel. Typically, the refluxing step is performed for a time period from about 10 to about 120 hours, with a time period from about 20 to about 60 hours being more highly preferred. During the course of the refluxing, the pH of the reaction mixture containing the suspension is monitored. If the pH is not between 10–12, a base or acid (depending on the measured pH) is added dropwise to control the pH within the range mentioned above. Examples of bases that can be used at this point of the present invention include, but are not limited to: NaOH, KOH, LiOH, $NH_4OH$, and mixtures thereof Suitable acids that can be employed to control the pH of the suspension include, but are not limited to: HCl, $HNO_3$, HF, HBr, HI, and similar mixtures thereof.

After the refluxing step, the stirring is stopped and the suspension is allowed to settle to the bottom of the reaction vessel. Samples of the thus formed perovskite nanotubes are obtained by washing the nanotubes with hot water, followed by drying the resultant white precipitate in an oven. The yield of perovskite nanotubes recovered from the inventive hydrothermal synthesis process is typically on the order of about 50% or greater, with a yield from about 85 to about 95% being more typical.

Small traces of amorphous materials, less than 1%, as well as unreacted starting materials, less than 2%, and carbonate impurities, less than 1% may be present in the final nanotube product.

As indicated above, perovskite nanotubes such as $BaTiO_3$ and $SrTiO_3$ can be synthesized under the mild, low-temperature solution conditions mentioned above. The reaction conditions employed in the present invention provide small nanotubes that have a high aspect ratio and a hollow interior cavity. Because of their hollow morphology, the inventive nanotubes can be readily used as a nanoscale host material.

In particular, the inventive perovskite nanotubes can be used in numerous molecular electronic applications such as, for example, random access memory, logic circuitry, pyroelectronic detectors, imaging detectors, optical memories, modulators, deflectors, transducers, actuators, and high-k dielectrics. Additionally, the inventive perovskite nanotubes can be used for ferroelectric random access memory (FRAM) with a 1-Gbit density or higher and logic circuitry—the next generation of components for molecular electronics and molecular computers. Ferroelectric materials, such as $BaTiO_3$ and $SrTiO_3$, have been under intensive investigation because of the prospect that their stable polarizations states could be used to encode the 1 and 0 of Boolean algebra, which forms the basis of memory and circuitry.

Illustrative examples of structures in which an array of the inventive perovskite nanotubes can be employed include, for example, nanotransducers, nanoactuators, positive temperature coefficient resistors, multilayer capacitors, electro-optical, ferroelectrics, relaxors, and thermistors.

The following are also examples of the proposed technology: ferroelectric random access memory; nonvolatile memories; dynamic random access memory; electrooptic devices; and electromechanical devices.

EXAMPLE 1

Preparation of $TiO_2$ Nanotube Templates $TiO_2$ nanotube structural templates were prepared using the procedures described in T. Kasuga, et al., Langmuir, 1998, 14, 3160, and T. Kasuga, et al., Adv. Mater., 1999, 11, 1307. Specifically, 2.5 g anastase powder (Aldrich) was dissolved in a 20 ml, 10 M NaOH aqueous solution in a Nalgene flask, and refluxed over an oil bath for 20 hrs with continuous stirring. The resultant mixture was then treated with 0.1 M HCl solution and distilled water and thereafter sonicated. The treated powders were separated from the washing solution by centrifugation. The washing steps were repeated until the supernatant had a pH of less than 6.

EXAMPLES 2 AND 3

Preparation of Barium Titanate and Strontium Titanate Nanotubes

In a typical reaction to generate barium titanate and strontium titanate nanotubes, a mixture of $Ba(OH)_2$ or $SrCl_2$ (depending on whether the Ba or Sr perovskite nanostructure is desired) and the generated $TiO_2$ nanotubes of Example 1 (with an initial molar ratio of 1:1) were combined under Schlenk conditions. In order to minimize contamination of products from atmospheric $CO_2$, which could lead to the generation of carbonate impurities, the flask was thoroughly degassed upon the addition of deionized water.

The reaction mixture was subsequently refluxed over an oil bath for 20–60 h with stirring, under argon or nitrogen. The pH of the suspension was noted to be between 10 and 12, which was sufficiently high for the formation of the transition metal oxide nanotubes. Dropwise addition of sodium hydroxide and hydrochloride acid was used to control the pH of the resulting suspension. After the reaction, the suspension settled to the bottom and samples of the formed nanotubes were obtained by washing of the reaction products with hot water, following by drying of the resultant white precipitate in an oven.

The products were characterized by a number of different methodologies, including X-ray diffraction measurement (XRD, Philips vertical diffractometer using Cu K alpha radiation with lambda =1.54 Å), transmission electron microscopy (TEM), as well as by selected area electron diffraction (SAED) and energy-dispersive X-ray spectroscopy (EDAX).

Figure 2A:
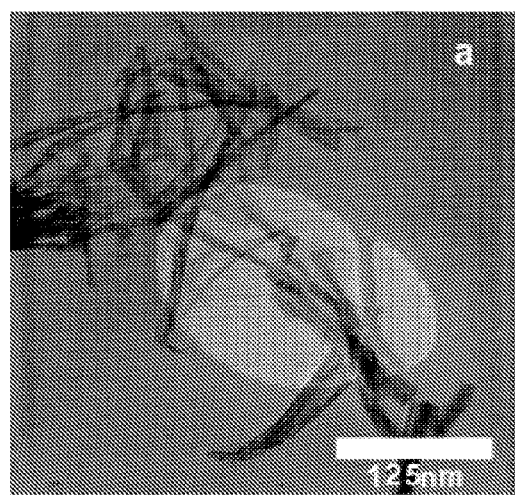
FIGS. 2A–2C are transmission electron microscope (TEM) images of (A) $TiO_2$ nanotubes, (B) $BaTiO_3$ nanotubes and (C) $SrTiO_3$ nanotubes. Inserts in FIGS. 2B and 2C show higher magnification images (50 nm×50 nm in FIG. 2B and 40 nm×60 nm in FIG. 2C) of single tubes and electron diffraction patterns, respectively.
Figure 2B:
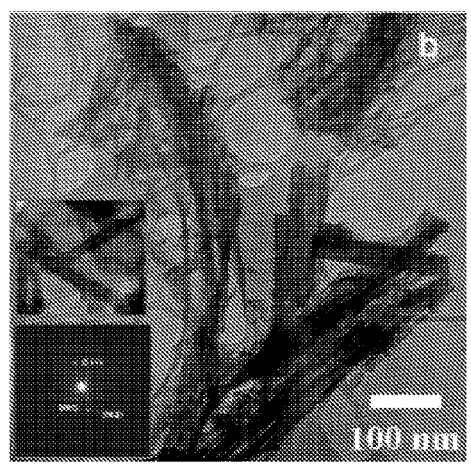
Figure 2C:
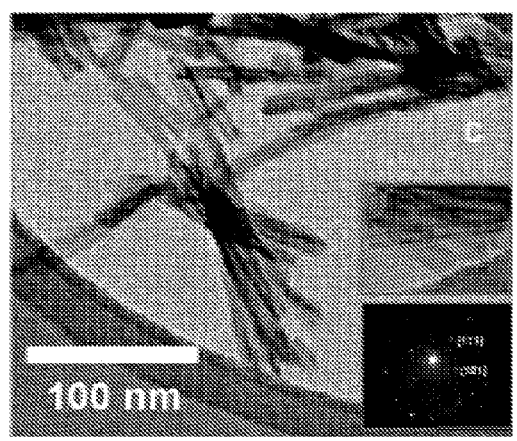

Representative TEM images are presented in FIGS. 2A–2C. Specifically, FIG. 2A is a representative TEM image of the $TiO_2$ nanotube structural template used in the present invention. Analysis revealed that the observed needle-shaped structures have a tubular form with an inner diameter of about 4 nm and an outer diameter of about 8 nm, and a length of about several hundred nm, all of which are consistent with literature results.

FIGS. 2B and 2C illustrate $BaTiO_3$ and $SrTiO_3$ nanotubes obtained from the inventive hydrothermal syntheses process. Examination of these images shows that the outer diameter range of the $BaTiO_3$ and $SrTiO_3$ nanotubes is from 8 to 15 nm, the inner diameter range is from 4 to 7 nm, and that their lengths vary from 50 to over 500 nm. EDAX elemental analysis data not shown confirmed the presence of Ba/Sr, Ti, and O elemental signatures associated with the products in expected stoichiometric proportions. Electron diffraction patterns obtained from the $BaTiO_3$ and $SrTiO_3$ nanotubes are presented as insets to FIGS. 2B and 2C, respectively. The diffraction pattern is consistent with a perovskite structure in each case. However, the synthesized tubes likely have small amounts of amorphous as well as unreacted starting materials in addition to carbonate impurities associated with them. To identify the phase of the perovskite tubes, the rings resulting from electron diffraction were indexed to the XRD of the bulk material by the method of comparative d-spacing.

Figure 3A:
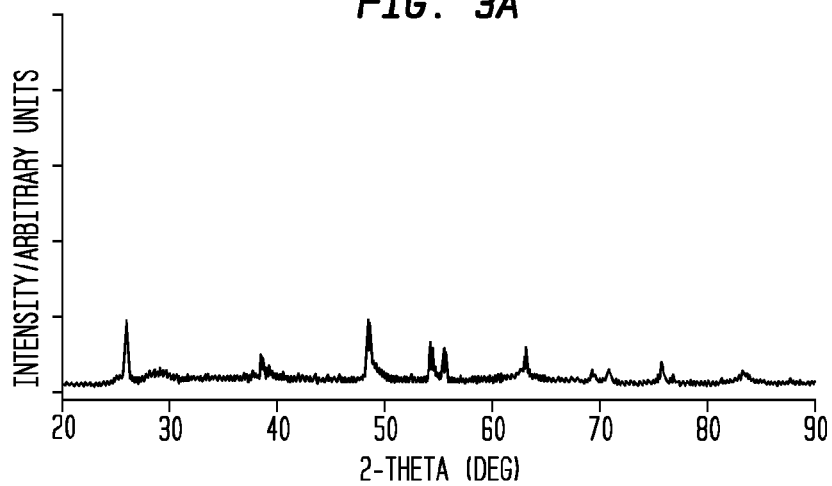
FIGS. 3A–3C are powder X-ray diffractograms of the $TiO_2$, $BaTiO_3$ and $SrTiO_3$ nanotubes shown in FIGS. 2A–2C. The * represents unreacted $TiO_2$ and the # denotes $BaCO_3/SrCO_3$ byproducts, respectively.
Figure 3B:
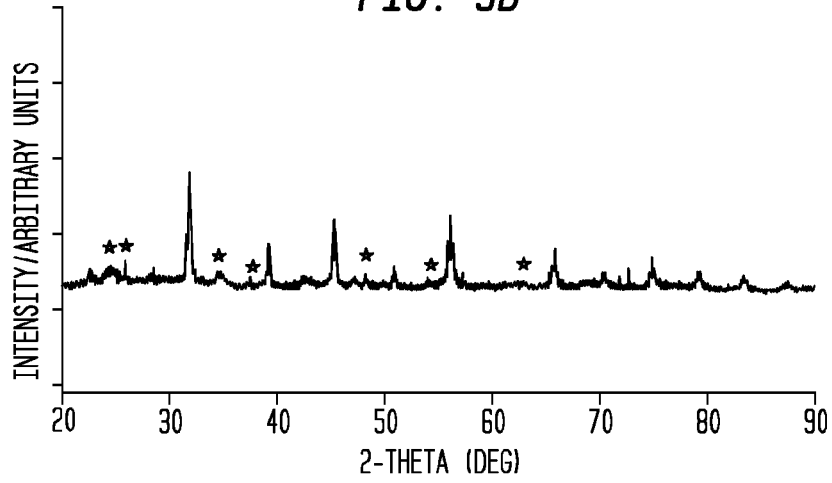
Figure 3C:
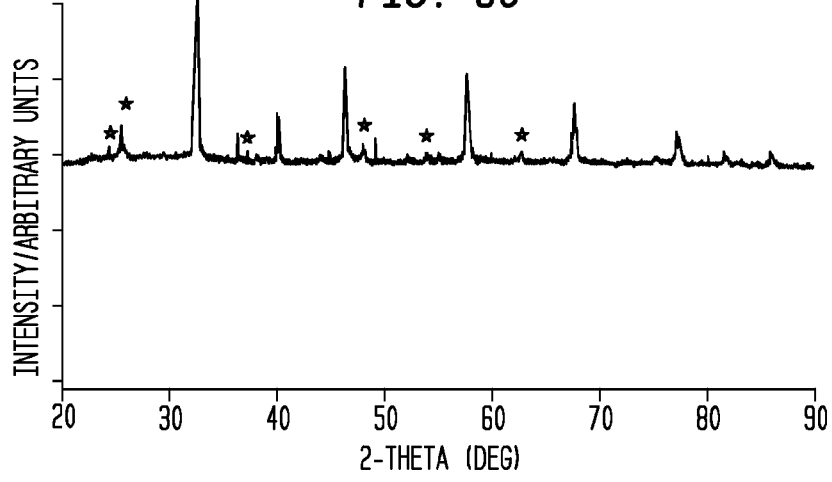

The powder X-ray diffraction patterns (FIGS. 3A–3C) demonstrate conversion of the precursor $TiO_2$ nanotube, composed of a crystalline phase of anastase, to crystalline $BaTiO_3$ and $SrTiO_3$ nanotubes with a cubic perovskite structure. The unit cell parameters for $BaTiO_3$ and $SrTiO_3$ have been determined to be 3.975 and 3.889 Å, respectively, in agreement with bulk cubic materials. The powder XRD also showed small traces of unreacted $TiO_2$ and carbonate byproducts. Some amount of the carbonate was also formed despite careful degassing. A certain amount of excess $TiO_2$ is inevitable due to thermodynamic and stoichiometric considerations. In other words, in order to minimize the production of unwanted impurities, the loading of Ba/Sr precursors proposed herein is lower than what would have been required to completely transform all of the $TiO_2$. Indeed, higher Ba/Sr loadings in the reaction mixture would have led to a much greater formation of a carbonate byproduct.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A monophasic perovskite nanotube having an outer diameter from about 1 nm to about 500 nm and a length from about 10 nm to about 10 μm.

2. The monophasic perovskite nanotube of claim 1 wherein the nanotube has a cubic crystalline structure, a rhombohedral crystalline structure, an orthorhombic crystalline structure or a tetragonal crystalline structure.

3. The monophasic perovskite nanotube of claim 1 wherein the perovskite nanotube has the formula $ABO_3$ wherein B is at least one metal selected from Group IVB, VB, VIB, VIIB, VIIIB, IB, or IIB of the Periodic Table of Elements, and A is at least one additional cation having a positive formula charge of from 1 to 3.

4. The monophasic perovskite nanotube of claim 3 wherein A is selected from the group consisting of K, Na, Rb, Cs, Li, Ba, Sr, La, Pb, Zn, Ca, Mg, Sc, Y, and mixtures thereof.

5. The monophasic perovskite nanotube of claim 3 wherein A is selected from the group consisting of Ba, Sr and mixtures thereof.

6. The monophasic perovskite nanotube of claim 3 wherein A is Ba and B is Ti.

7. The monophasic perovskite nanotube of claim 3 wherein A is Sr and B is Ti.

8. The monophasic perovskite nanotube of claim 1 wherein the outer diameter is from about 8 nm to about 100 nm.

9. The monophasic perovskite nanotube of claim 1 further comprising an inner diameter from about 0.5 nm to about 500 nm.

10. The monophasic perovskite nanotube of claim 1 wherein the nanotube has an aspect ratio of about 2 or greater.

11. A monophasic nanotube comprising a perovskite having the formula $ATiO_3$ wherein A is Sr, Ba or a mixture thereof, said nanotube having an outer diameter from about 1 nm to about 500 nm and a length from about 10 nm to about 10 μm.

12. A method of fabricating a perovskite nanotube comprising the steps of:
providing a metal oxide nanotube structural template comprising a metal selected from Group IVB, VB, VIB, VIIB, VIIIB, IB or IIB of the Periodic Table of Elements;
adding, in the absence of air, and $CO_2$, at least one precursor compound comprising a cation having a positive formula charge of from 1 to 3 to said nanotube structural template to provide a reaction mixture;
refluxing the reaction mixture in an inert atmosphere at a temperature of about 150° C. or less to provide a suspension of perovskite nanotubes; and
recovering the perovskite nanotubes from the suspension.

13. The method of claim 12 wherein the perovskite nanotubes have the structural formula $ABO_3$ wherein B is at least one metal selected from Group IVB, VB, VIB, VIIB, VIIIB, IB or IIB of the Periodic Table of Elements, and A is at least one additional cation having a positive formula charge of from 1 to 3.

14. The method of claim 13 wherein A is selected from the group consisting of K, Na, Rb, Cs, Li, Ba, Sr, La, Pb, Zn, Ca, Mg, Sc, Y, and mixtures thereof.

15. The method of claim 14 wherein A is selected from the group consisting of Ba, Sr and mixtures thereof.

16. The method of claim 13 wherein A is Ba and B is Ti.

17. The method of claim 13 wherein A is Sr and B is Ti.

18. The method of claim 12 wherein the nanotube structural template is prepared by dissolving a powder of a metal oxide in a base solution, treating the dissolved metal oxide with an acid, sonicating the acid treated dissolved metal oxide to provide metal oxide nanotubes and recovering the metal oxide nanotubes.

19. The method of claim 12 wherein the nanotube structural template comprises $TiO_2$ nanotubes.

* * * * *